US006461786B1

(12) United States Patent
Sasaki et al.

(10) Patent No.: US 6,461,786 B1
(45) Date of Patent: Oct. 8, 2002

(54) RECORDING APPARATUS AND METHOD

(75) Inventors: Yoshiharu Sasaki; Mitsuru Yamamoto, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 49 days.

(21) Appl. No.: 09/589,293

(22) Filed: Jun. 8, 2000

(30) Foreign Application Priority Data

Jun. 10, 1999 (JP) .......................................... 11-164032

(51) Int. Cl.[7] .............................. G03F 7/34; G03F 7/11

(52) U.S. Cl. .................... 430/200; 430/201; 430/271.1; 430/945; 430/964

(58) Field of Search ................................ 430/200, 201, 430/964, 271.1, 945

(56) References Cited

U.S. PATENT DOCUMENTS

| | | | | | |
|---|---|---|---|---|---|
| 5,352,562 | A | * | 10/1994 | Takahashi et al. | 430/200 |
| 5,501,937 | A | * | 3/1996 | Matsumoto et al. | 430/200 |
| 5,534,383 | A | * | 7/1996 | Takahashi et al. | 430/200 |
| 5,578,824 | A | * | 11/1996 | Koguchi et al. | 250/318 |
| 5,580,693 | A | * | 12/1996 | Nakajima et al. | 430/200 |
| 5,935,902 | A | * | 8/1999 | Imamura | 430/200 |
| 6,228,555 | B1 | * | 5/2001 | Hoffend et al. | 430/200 |
| 6,270,934 | B1 | * | 8/2001 | Chang et al. | 430/200 |
| 6,284,425 | B1 | * | 9/2001 | Staral et al. | 430/200 |

FOREIGN PATENT DOCUMENTS

| | | | |
|---|---|---|---|
| JP | 4-296594 | 10/1992 | B41M/5/40 |
| JP | 4-327982 | 11/1992 | B41M/5/26 |
| JP | 4-327983 | 11/1992 | B41M/5/26 |
| JP | 7-290731 | 11/1995 | B41J/2/32 |

* cited by examiner

*Primary Examiner*—Richard L. Schilling
(74) *Attorney, Agent, or Firm*—Sughrue Mion, PLLC

(57) ABSTRACT

In an image recording process comprising the steps of superposing a transfer film on an receiver film, said transfer film having an opto-thermal converting layer and a toner layer on a support and said receiver film having an image receiving layer on a support, said toner layer being opposed to said image forming layer, transferring said toner layer onto said image receiving layer by exposure of laser beam, and stripping said transfer film from said receiver film to form an image, the thickness of said opto-thermal converting layer is adjusted such that the distance from the position where a peak temperature occurs in the direction of thickness of the opto-thermal converting layer to said toner layer is within the range from zero to a third of the thickness of said opto-thermal converting layer. This design permits satisfactory image recording without undesired density drop.

4 Claims, 10 Drawing Sheets

FIG. 11( f )

RECORDING APPARATUS AND METHOD

BACKGROUND OF INVENTION

1. Field of the Invention

This invention relates to a recording apparatus for performing transfer recording with a laser beam from an optical head being applied to a recording medium fixed on a recording rotating drum, more particularly, to one that is free from the problem of density drop.

2. Description of the Related Art

The recording apparatus contemplated by the invention records image with a laser beam from an optical head being applied to a recording medium fixed on a recording rotating drum (hereunder referred to as a "recording drum") or a recording plane. The recording medium is the collective term for the combination of an receiver film fixed on the rotating drum and a transfer film fixed onto the receiver film to cover it.

FIG. 8 shows in conceptual form the entire part of the recording apparatus contemplated by the invention. The recording apparatus generally indicated by 30 is adapted for producing a full color image and to this end, it comprises a recording medium supply section 32, a rotating drum 34, a recording medium fix/release mechanism 36 provided on the rotating drum 34, a laminating mechanism 38 provided along the periphery of the rotating drum 34, an optical head 40, a stripping mechanism 42, a sheet feed section 44, a laminating section 46, a fixing section 48, a stripping section 50, a tray section 52 and a control section 54.

In the recording apparatus 30, the recording medium supply section 32 supplies an receiver film R and a transfer film T onto the rotating drum 34. The receiver film R is first fixed on the rotating drum 34 by means of the recording medium fix/release mechanism 36 and then the transfer film T is superposed on the receiver film R as it is adhered under thermal compression by the laminating mechanism 38. The heating step may be omitted depending on the type of the recording medium used.

In the next step, the optical head 40 being controlled in accordance with a picture signal by the control section 54 performs imagewise exposure with a laser operating in heated mode to record a latent image. Subsequently, the transfer film T is stripped from the receiver film R remaining on the rotating drum 34 by means of the stripping mechanism 42, whereupon the latent image on the transfer film T is transferred to the receiver film R and developed to form a visible image on the receiver film R. The same procedure is repeated for 3 or 4 colors to form a color image on the receiver film R which, in turn, is laminated with hard sheet H supplied from the sheet feed section 44. After adhesion, an image receiving layer 16 in the receiver film R is photocured in the fixing section 48. The hard sheet H now having the full color image is stripped from the receiver film R in the stripping section 50 and ejected onto a proof tray 52*a* whereas the receiver film R is ejected into a waste stacker 52*b*.

In this way the full color image is obtained as a hard copy. The recording medium supply section 32 comprises a recording medium station 53 holding a plurality of recording mediums (i.e., rolls of heat sensitive materials such as a roll of receiver film R and a plurality of transfer films T such as standard transfer films for K (black), C (cyan), M (magenta) and Y (yellow) as well as sheets for special colors like gold and silver that are used in the printing field), a pair of rollers 54 for pulling out a single recording medium, a cutter 55 with which a predetermined length of the recording medium pulled out of the recording medium station 53 by the pull-out rollers 54 is cut in sheet form, a pair of rollers 56 for nipping and transporting the sheet of recording medium, and a guide 57 with which the sheet of recording medium is guided on the rotating drum 34 up to the position where the leading edge of the recording medium is fixed by the recording medium fix/release mechanism 36 on the rotating drum 34.

The receiver film R is first supplied to the rotating drum 34. Its leading edge is clamped or otherwise fixed to the mechanism 36 and, as the rotating drum 34 rotates in the direction of the arrow, the receiver film R is wound onto the outer surface of the rotating drum 34. The trailing edge of the receiver film R is also fixed by the recording medium fix/release mechanism 36. Preferably, at least one of the portions of the recording medium fix/release mechanism 36 which fix the leading and trailing edges of the receiver film R is adapted to be movable on the outer surface of the rotating drum 34 so that various lengths of recording medium in sheet form can be fixed onto the rotating drum 34.

After the receiver film R has been wound onto the periphery of the rotating drum 34, the transfer film T that has been transformed from the recording medium supply section 32 in a completely identical manner is wound onto the receiver film R in superposition. This step of superposing the transfer film T on the receiver film R is performed by the laminating mechanism 38 consisting of a laminating roller 58 having a built-in heater (not shown), an arm 59 which rotates the laminating roller 58 about a fulcrum 59*a* so that it contacts or separates from the outer surface of the rotating drum 34, and a depressing means 60 for depressing the laminating roller 58 against the outer surface of the rotating drum at a predetermined pressure. The depressing means 60 may be an urging means such as a spring or an air cylinder manipulator.

The image receiving layer forming the outermost part of the receiver film R is tacky and can be laminated with the transfer film as it is depressed under a predetermined pressure by the laminating roller 58. Therefore, the image receiving layer in the receiver film R and the toner layer in the transfer film T can be adhered to each other not only without developing wrinkles and other surface defects in the transfer film T but also achieving a uniform adhesive force.

In order to ensure uniform and strong bonding, the transfer film T is laminated to the receiver film R by means of the pressure laminating roller 58. In order to provide a greater adhesive force, the laminating roller 58 is preferably heated as it is pressed onto the rotating drum during lamination. The heating temperature is not more than 130° C., preferably not more than 100° C.

When winding the receiver film R onto the rotating drum 34, its leading edge is preferably fixed by the recording medium fix/release mechanism 36 while the other portion is retained by the transport roller pair 56 or the laminating roller 58 or some other means so that it can be wound onto the periphery of the rotating drum 34 under tension. As will be mentioned later, suction holes may be formed in the outer surface of the rotating drum 34 so that the receiver film R can be sucked onto the rotating drum by a suction means. While the suction means is preferably used in combination with the recording medium fix/release mechanism 36, either one of them may be used alone. In this way, the receiver film R can be fixed onto the periphery of the rotating drum 34 without developing wrinkles or other surface defects and without causing positional offsets. Tension is preferably applied when the transfer film T is superposed on the receiver film R after it has been wound onto the rotating drum 34. Again, the recording medium fix/release mechanism 36 may be used to fix the leading edge and/or trailing edge of the transfer film T and the above-mentioned suction means may also be used in combination with the recording medium fix/release mechanism 36. Preferably, the tension to be applied to the transfer film T being superposed is smaller than the tension to be applied to the receiver film R as it is wound onto the rotating drum 34.

The optical head 40 comprises a laser head 24 and an sub scanning means 61. The laser head 24 consists basically of a laser beam source which includes a modulation means and emits high-density energy light such as a laser beam and an imaging lens which adjusts the diameter of a beam spot of laser beam. The sub scanning means 61 moves the laser head 24 axially or in a direction parallel to the shaft of the rotating drum 34 (normal to the paper of FIG. 8) for performing sub scanning.

To perform main scanning of the transfer film T with laser beam, the rotating drum 34 is rotated. If desired, the sub scanning means 61 in the optical head 40 may be replaced by an axial moving means on the rotating drum 34 so that the latter is rotated for main scan and moved axially for sub scan.

Any laser beam source will do as long as it can emit high-density energy light capable of exposure in heated mode and exemplary lasers that can be used include gas lasers such as an argon ion laser, a helium neon laser and a helium cadmium laser, solid lasers such as a YAG laser, semiconductor lasers, as well as dye lasers and excimer lasers. Modulation of laser beam with a picture signal can be performed by any known methods; in the case of an argon ion laser, the laser beam is passed through an external modulator; in the case of a semiconductor laser, the electric current being injected into the laser is controlled by a signal (to effect direct modulation). The size of the laser spot formed by focusing on the opto-thermal converting layer and the scanning speed are set in accordance with the resolving power required for the image to be recorded and the recording sensitivity of the material. For use in printing, high resolving power is generally required and better image quality is obtained by a smaller beam spot; on the other hand, the depth of focus is so small that it is difficult to control mechanically. If the scanning speed is unduly slow, the heat loss due to heat conduction to the support of the transfer film so much increases that energy efficiency decreases and the recording time increases. In view of these, the recording conditions to be adopted in the present invention are such that the beam diameter on the opto-thermal converting layer is 5–50 $\mu$m, preferably 6–30 $\mu$m, and the scanning speed is at least 1 m/s, preferably at least 3 m/s.

The picture signal as sent to the recording apparatus 30 of the invention from an external image reading apparatus, image processing apparatus, work station (W/S) having a DTP capability, electronic publishing system and various storage media (e.g., magnetic tape, floppy disk, hard disk and RAM card) is transmitted to the control section 54 as a digital signal via an interface or the like, given necessary processing and further transmitted to the optical head 40 for controlling exposure to the laser in heated mode on the laser head 24.

The control section 54 controls not only sub scan by the sub scanning means 61 on the optical head 40 and main scan by the rotation of the rotating drum 34 but also the operation of the individual parts of the recording apparatus 30 and the overall sequence of their operations.

The first function of the stripping mechanism 42 is to strip the transfer film T from the receiver film R after a latent image has been formed on the transfer film T by exposure to the laser in heated mode on the optical head 40. The second function of the stripping mechanism 42 is to help transfer the latent image onto the receiver film R for subsequent development. To perform these functions, the stripping mechanism 42 comprises a strip roller 62, two split rollers 63 and 64 in contact with the strip roller 62, a comb-toothed guide plate 65 provided between the segments of each split roller (63, 64) along the strip roller 62, and a bracket (not shown) on which these components are mounted integrally. The strip roller 62 is axially supported on an arm 67 and rotates about a fulcrum 67*a* so that it contacts or separates from the outer surface of the rotating drum 34. Also provided is a depressing means 68 by which the strip roller 62 is pressed against the laminate of the receiver film R and the transfer film T on the rotating drum 34 via the arm 67.

When the laminate of the transfer film T having a latent image formed on it as a result of decrease in the adhesion of the toner layer 22 due to imagewise application of thermal energy upon exposure to the laser in heated more and the receiver film R having the image receiving layer 16 adhered to the toner layer 22 has come close to the stripping mechanism 42, the arm 67 rotates about the fulcrum 67a to bring the bracket closer to the laminate and the comb-toothed guide plate 65 is slipped between the image receiving layer 16 in the receiver film R and the toner layer 22 in the transfer film T while, at the same time, the laminate is depressed from the transfer film (T) side by the strip roller 62. If the transfer film T and the receiver film R to be joined are slightly offset in length, the comb-toothed guide plate 65 can be easily slipped between the two sheets. After the above-described step, the rotating drum 34 is rotated and, at the same time, the strip roller 62 and the split rollers 63 and 64 are rotated so that the leading edge of the transfer film T is moved along the comb-toothed guide plate 65 until it is nipped between the strip roller 62 and each of the split rollers 63 and 64. Thus, the transfer film T as it is depressed by the strip roller 62 is nipped between the strip roller 62 and each of the split rollers 63 and 64 and transported so that it is stripped from the receiver film R. Since the transfer film T is stripped from the receiver film R at a constant speed in the area depressed with the stripping roller 62, the stripping force can be held constant and, in the absence of any vibrational phenomena such as stick slip, there will be no unevenness in stripping. Since the stripping force being applied to the receiver film R does not vary during stripping, there will be no offset in the position where the receiver film R is fixed on the rotating drum 34. This eliminates the possibility of drop in the precision of registration. Hence, one can produce a monochromatic halftone image of high quality, high resolution and high gradation that is free from unevenness in stripping, misregistration and any other defects.

By repeating the same procedure for C, M, Y and K colors, four color images are stripped, transferred and developed in exact registration on the receiver film R, which is then guided by two guides 70 for transport to the laminating section 46 by means of a transport roller 71.

In the laminating section 46, a hard sheet supply roll 72 delivers a hard sheet H from a cassette 73 in synchronism with the transport of the receiver film R and the hard sheet H is transported to the right of FIG. 8 as it is guided by the guide member 70. If desired, the hard sheet H may be fed to the hard sheet supply roller 72 along a hand-feed chute 44*a*. Subsequently, the receiver film R and the hard sheet H are laminated with registry achieved by a registration roller pair 75 and the resulting laminate is transported to the fixing section 48.

The laminating section may be provided as a separate entity from the recording apparatus.

In the fixing section 48, the laminate of the receiver film R and the hard sheet H is nipped and transported by a heat/fix roller pair 76 consisting of a compression roller 76*a*and a heating roller 76*b* so that it is heated for fixing. The laminate is also subjected to post-exposure under uv lamps 77 so that the image receiving layer 16 in the receiver film R hardens to become readily strippable.

This fixing step may be omitted depending upon the type of the recording medium used.

In the next step, the laminate goes to the stripping section 50, where the readily strippable image receiving layer 16 is stripped from the other part of the receiver film R by means of a stripping roller pair 78 and a stripping guide 79, whereupon the image receiving layer 16 adheres to the hard sheet H to have the image transferred to the latter. The hard sheet H now carrying the transferred image is ejected as a hard copy onto the proof tray 52*a* in the tray section 52 whereas the receiver film R which has been stripped of the image receiving layer 16 is dumped into the waste tray 52*b*.

FIG. 9 is a perspective view showing the essential parts of the recording apparatus shown in FIG. 8. Referring to FIG. 9, numeral 1 designates the optical head capable of one-dimensional movement and which emits a plurality of laser beams that can be modulated to turn on and off in accordance with the data to be recorded; 2 is the fast rotating drum with a recording medium mounted thereon; 3 is the recording medium having a different structure depending upon to which use it is put, such as for use in CTP (computer to plate), DDCP (direct digital color proofer) or lithography; 4 is a moving stage (or an sub scanning stage) which, with the optical head 1 mounted thereon, is capable of moving along rails in a direction parallel to the recording medium 3 on the rotating drum 2. As the stage 4 moves, the optical head 1 applies a laser beam to the recording medium 3 for recording purposes. The movement of the stage 4 corresponds to sub scan in image formation and main scan is performed in the rotating direction of the drum 2.

We now describe the structure of the recording medium 3 with reference to FIG. 10 which shows separately the receiver film R and the transfer film T that combine to form the recording medium 3 shown in FIG. 9. In the actual step of recording on the recording medium 3, a thermal transfer sheet is used that constitutes a recording medium of the type shown in FIG. 10. The transfer film T consists of, in order from the side to be illuminated with laser beam, a support, an opto-thermal converting layer and a toner layer whereas the receiver film R consists of, in order from the transfer film (T) side, an image receiving layer, a cushion layer and a support. The transfer film T is superposed on the receiver film R, with the toner layer in contact with the image receiving layer, and the resulting laminate is illuminated with laser beam, whereupon the illuminated part of the toner layer is thermally transferred to the image receiving layer.

The support in the transfer film T shown in FIG. 10 is made of a laser beam transparent material such as a PET (polyethylene terephthlate) base, a TAC (triacetyl cellulose) base or a PEN (polyethylene naphthalate) base. The opto-electric converting layer is made of a material capable of efficient conversion of laser energy into heat and examples of such material include carbon, a black substance, an infrared absorbing dye and a specified wavelength absorber. The toner layer is available as transfer films of K (black), C (cyan), M (magenta) and Y (yellow) colors. Transfer films of various other colors such as gold, silver, brown, gray, green and orange may sometimes be used. Transfer films of different colors have different heating and recording characteristics.

The image receiving layer in the receiver film R serves to receive the toner being transferred from the transfer film T. The cushion layer is capable of absorbing the steps that may form when more than one stack of toner is provided.

The structures described above are variable with specific use and details about the toner and receiver films to be used are given in commonly assigned Unexamined Published Japanese Patent Application (kokai) Nos. 296594/1992, 327982/1992 and 327983/1992. An apparatus using such recording materials is also disclosed in commonly assigned Unexamined Published Japanese Patent Application (kokai) No. 290731/1995.

FIG. 11 shows the sequence of steps in the process of recording K, C, M and Y images on the receiver film R shown in FIG. 10. The process of recording each monochromatic image generally consists of three steps, laminating, laser recording with color data, and stripping the transfer film T from the receiver film R after recording.

Step 1: The receiver film R is wound onto the rotating drum 2 (FIG. 11*a*).

Step 2: To form K image, a K transfer film is wound onto the receiver film (FIG. 11*b*).

Step 3: If necessary, the K transfer film is laminated to the receiver film under a partly shown rotating roller (FIG. 11*c*).

Step 4: Using K image and character data, laser beam is applied to record image (FIG. 11*d*).

Step 5: The K transfer film is stripped from the image receiving sheet to complete the process of K image recording (FIG. 11*e*).

Step 6: The same procedure is repeated to record C image. The C transfer film is wound onto the image receiving sheet.

Step 7: The C transfer film is laminated to the image receiving sheet as needed.

Step 8: Perform laser recording with C data.

Step 9: Strip the C transfer film from the image receiving sheet to complete the process of C image recording.

Step 10: The same procedure is repeated to record M image. The M transfer film is wound onto the image receiving sheet.

Step 11: The M transfer film is laminated to the image receiving sheet as needed.

Step 12: Perform laser recording with M data.

Step 13: Strip the M transfer film from the image receiving sheet to complete the process of M image recording.

Step 14: The same procedure is repeated to record Y image. The Y transfer film is wound onto the image receiving sheet.

Step 15: The Y transfer film is laminated to the image receiving sheet as needed.

Step 16: Perform laser recording with Y data.

Step 17: Strip the Y transfer film from the image receiving sheet to complete the process of Y image recording.

Step 18: By these steps, the desired color image is formed, with K, C, M and Y colors superposed as appropriate on the receiver film (FIG. 11*f*).

Thus, in the recording apparatus, the recording medium consisting of the receiver film intimately overlaid with the transfer film using a heat fusible toner, a heat bonding toner or a sublimable toner is fixed on the rotating drum and illuminated with a laser beam from the optical head to record K, C, M and Y images either individually or in superposition.

The conventional recording mediums have had the problem that the toner layer in the transfer film deforms during recording to eventually cause a drop in density. This can be ascribed to the following two facts. First, in the conventional recording medium, a peak temperature observable in the direction of thickness occurs in the central portion of the opto-thermal converting layer. Second, the solvent used in the step of coating the support with the opto-thermal converting layer cannot be entirely removed in the subsequent drying step but partly remains in the dried opto-thermal converting layer. Since the central part of the opto-thermal converting layer becomes hot upon exposure to laser beam, the residual solvent in that central part evaporates to form gas; what is more, the opto-thermal converting layer has such a dense structure that the evaporating gas cannot dissipate to the outside but stays within to bulge the opto-thermal converting layer and eventually deform the toner layer.

The present invention has been accomplished under these circumstances and has as an object providing a recording medium in which the thickness of an opto-thermal converting layer can be adjusted to have general agreement with the position of a peak in temperature profile across the thickness of the opto-thermal converting layer.

This object of the invention can be attained by the recording apparatus recited in claim 1, which superposes a transfer film on an receiver film, said transfer film having an opto-thermal converting layer and a toner layer on a support and said receiver film having an image receiving layer on a support, said toner layer being opposed to said image forming layer, transfers said toner layer onto said image receiving layer by exposure of laser beam, and strips said transfer film from said receiver film to form an image, characterized in that the thickness of said opto-thermal converting layer is adjusted such that the distance from the position where a peak temperature occurs in the direction of thickness of the opto-thermal converting layer to said toner layer is within the range from zero to a third of the thickness of said opto-thermal converting layer.

The stated object of the invention can also be attained by the recording method recited in claim 2, which comprises the steps of superposing a transfer film on an receiver film, said transfer film having an opto-thermal converting layer and a toner layer on a support and said receiver film having an image receiving layer on a support, said toner layer being opposed to said image forming layer, transferring said toner layer onto said image receiving layer by exposure of laser beam, and stripping said transfer film from said receiver film to form an image, characterized in that the thickness of said opto-thermal converting layer is adjusted such that the distance from the position where a peak temperature occurs in the direction of thickness of the opto-thermal converting layer to said toner layer is within the range from zero to a third of the thickness of said opto-thermal converting layer.

The stated object of the invention can also be attained by the transfer film recited in claim 3 which has an opto-thermal converting layer and a toner layer on a support and which is characterized in that said opto-thermal converting layer has a thickness of 0.1–0.3 $\mu$m.

By adopting the structural designs described above, the thickness of the opto-thermal converting layer can be adjusted to have general agreement with the position of a peak in temperature profile across the thickness of the opto-thermal converting layer. Even if a gas evolves in the opto-thermal converting layer during exposure to laser beam, it can easily dissipate to the outside of the recording medium and will not remain in the opto-thermal converting layer; as a result, there is no bulging of the opto-thermal converting layer and satisfactory recording can be accomplished.

The stated object of the invention can also be attained by the recording apparatus recited in claim 4, which superposes a transfer film on an receiver film, said transfer film having an opto-thermal converting layer and a toner layer on a support and said receiver film having an image receiving layer on a support, said toner layer being opposed to said image forming layer, transfers said toner layer onto said image receiving layer by exposure of laser beam, and strips said transfer film from said receiver film to form an image, characterized in that at least one parameter selected from among the diameters, powers, arrangement, number and wavelengths of recording spots of said laser beam is adjusted such that the distance from the position where a peak temperature occurs in the direction of thickness of the opto-thermal converting layer to said toner layer is within the range from zero to a third of the thickness of said opto-thermal converting layer.

This design permits the intended adjustment of the distance of interest by appropriate adjustment of laser beam. Even if a gas evolves in the opto-thermal converting layer during exposure to laser beam, it can easily dissipate to the outside of the recording medium and will not remain in the opto-thermal converting layer; as a result, there is no bulging of the opto-thermal converting layer and satisfactory recording can be accomplished.

BRIEF DESCRIPTION OF THE DRAWINGS

FIG. 11*a*–FIG. 11*f* show the sequence of specific steps in the process of recording a color image.

DETAILED DESCRIPTION OF THE INVENTION

The preferred embodiments of the present invention are described below with reference to accompanying drawings.

The present inventors studied possible reasons for the deformation of the toner layer in the transfer film by computer simulation of the temperature changes that would occur in the direction of the thickness of a recording medium.

To begin with, we describe the mode of exposure to laser beam that is performed in the recording apparatus contemplated by the invention.

Figure 5A:
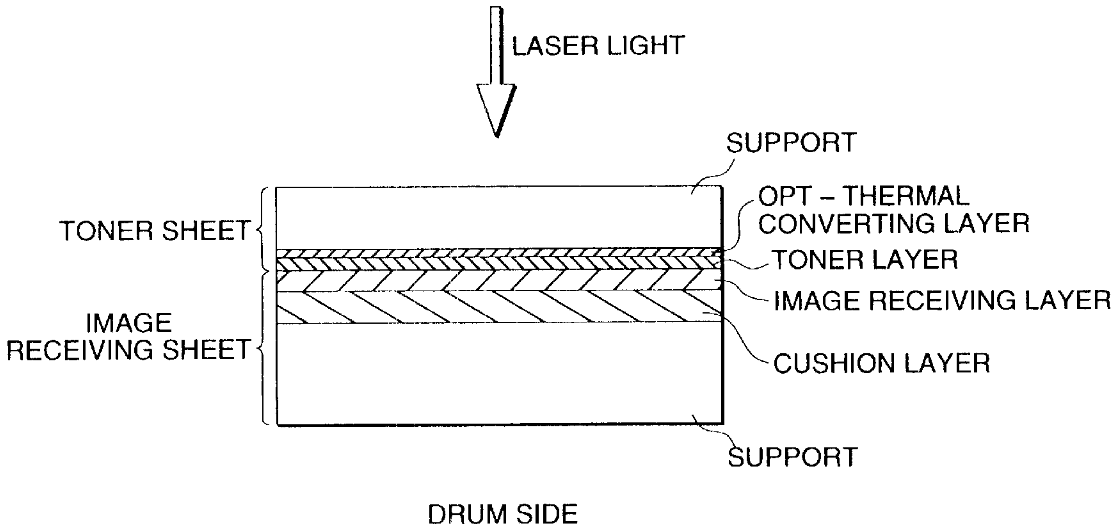
FIG. 5*a* is a cross section of the recording medium in the recording apparatus of the invention as it is illuminated with exposing laser beam.
Figure 5B:
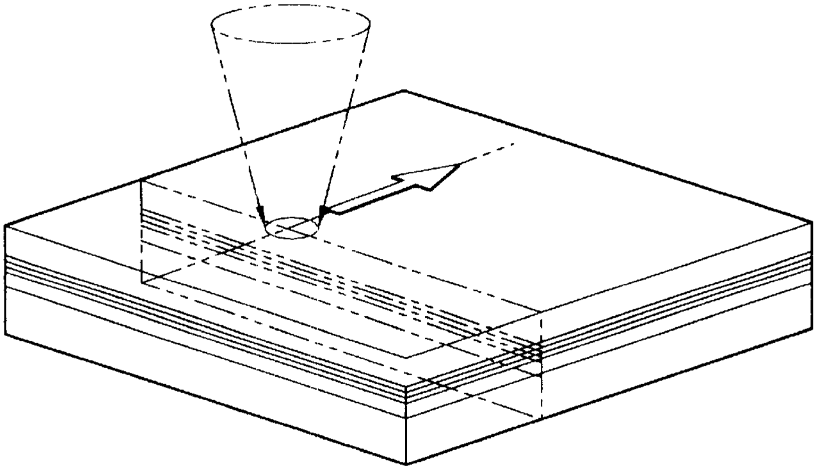
FIG. 5*b* is a perspective view showing the movement of a laser beam spot relative to the recording medium.

(1) FIG. 5*a* shows the cross-sectional structure of the recording medium used in the computer simulation. As shown, the transfer film consists of, in order from the side to be illuminated with laser beam, a support (clear PET), an opto-thermal converting layer and a toner layer. The receiver film consists of, in order from the transfer film side, an image receiving layer, a cushion layer and a support. Assume normal incidence of laser beam on the clear support in the transfer film. Also assume that the relative movements of the laser beam and the recording medium occur in a main scanning direction as shown in FIG. 5*b*. For such relative movements, the laser beam (beam spot) may be fixed and the recording medium moves in the main scanning direction or, alternatively, the recording medium may be fixed and the laser beam spot is moved in the main scanning direction.

(2) For calculations with a computer, the density, specific heat, heat conductivity, film thickness and light absorption coefficient of each layer in the recording medium were necessary and determined by preliminary investigation and measurements.

(3) Using these parameters, thermodynamic calculations were made by DSC (differential scanning calorimetry).

(4) The laser beam spot was adjusted to have a power of 250 mW.

Figure 6:
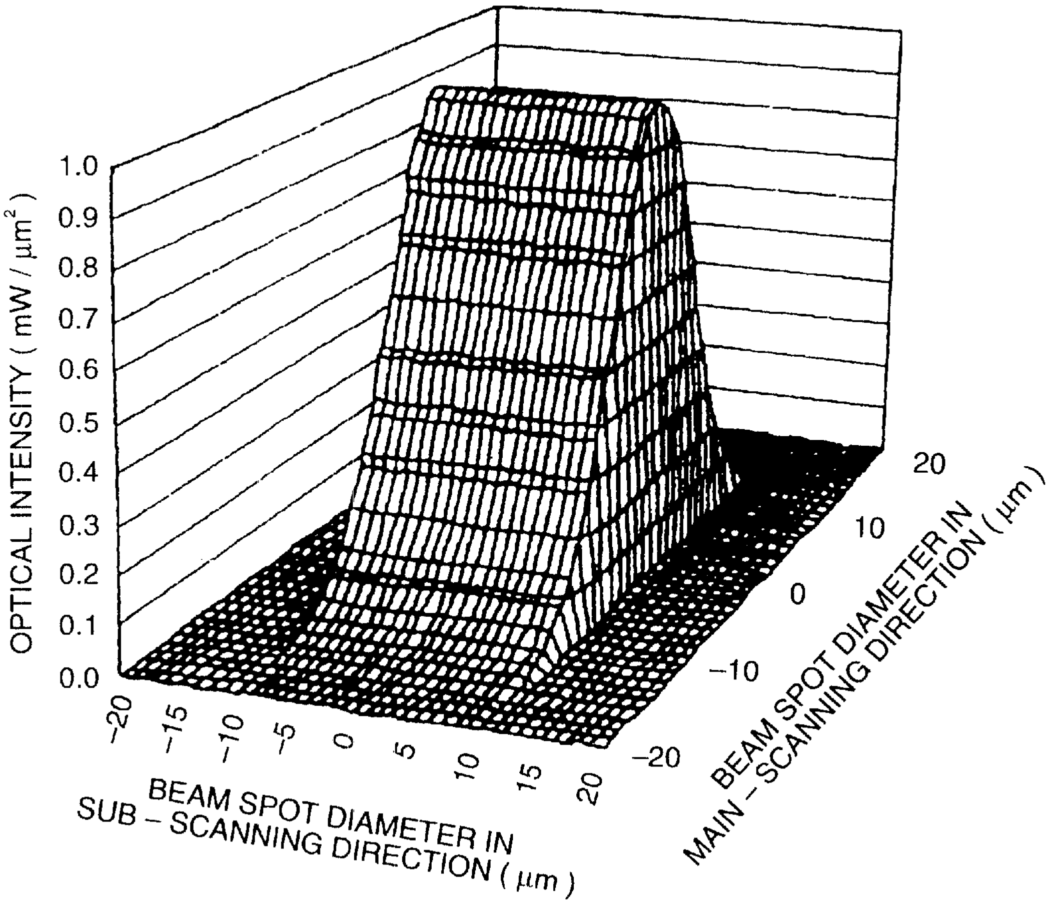
FIG. 6 is a perspective view showing the three-dimensional shape of a laser beam spot.

(5) The laser beam spot was controlled to have a three-dimensional shape as shown in FIG. 6 which was rectangular in the sub scanning direction and Gaussian in the main scanning direction (this shape is hereunder referred to as a "rectangular-Gaussian shape").

(6) This rectangular-Gaussian shape represents the distribution of light intensity issued from a common multi-mode semiconductor laser and can be easily obtained by focusing the laser beam on the recording medium with predetermined optics.

(7) The speed of scanning in the main direction was assumed to be 10 m/s.

Figure 7:
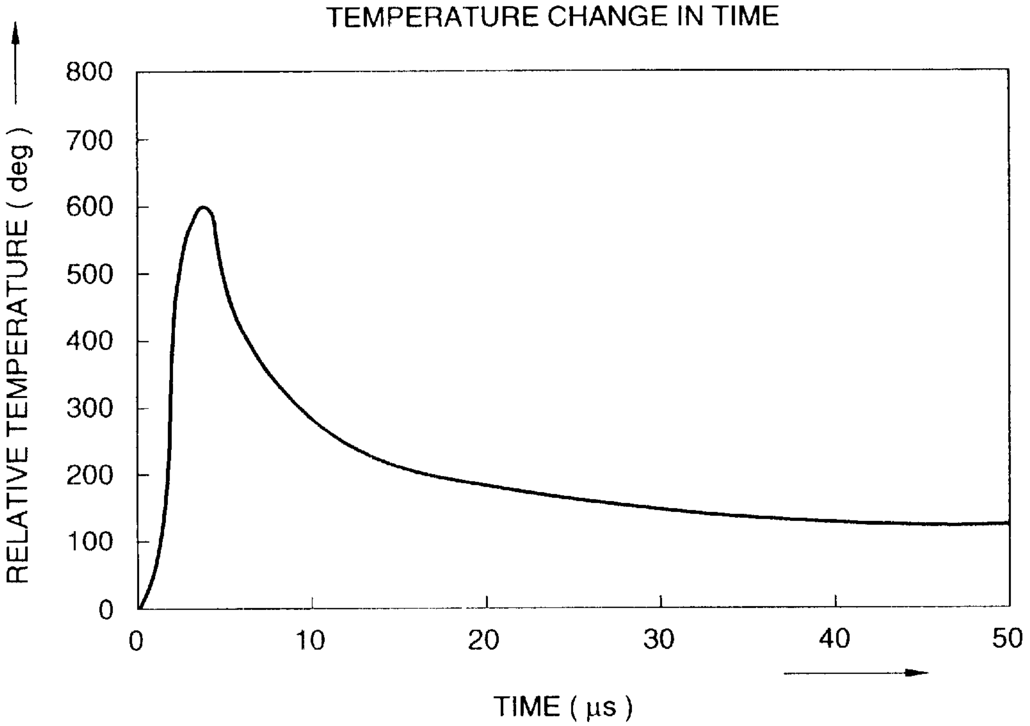
FIG. 7 is a graph showing the temperature change that occurs with time in the central part of a laser beam spot in an sub scanning direction.
Figure 8:
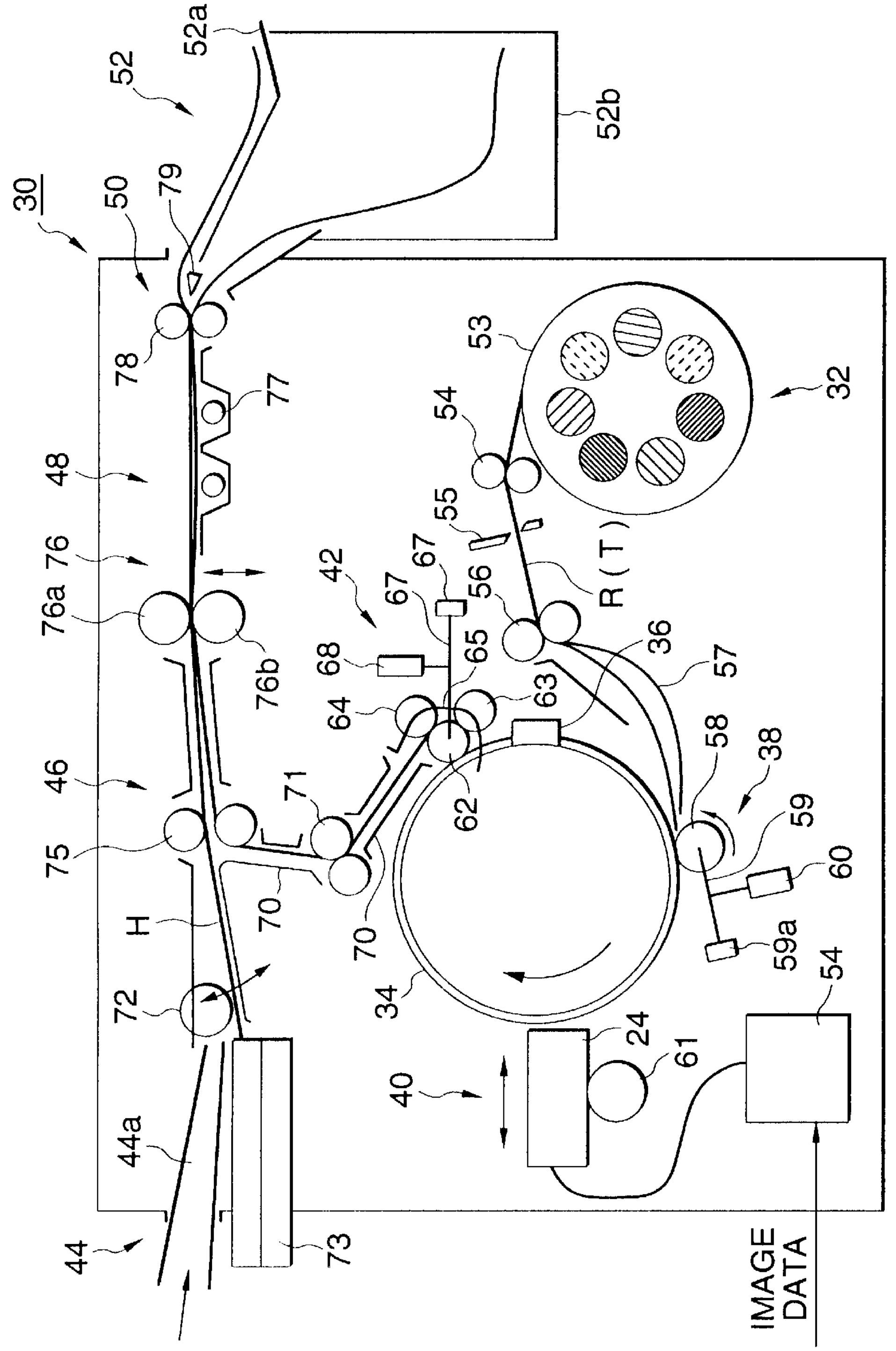
FIG. 8 shows in conceptual form the recording apparatus of the invention.
Figure 9:
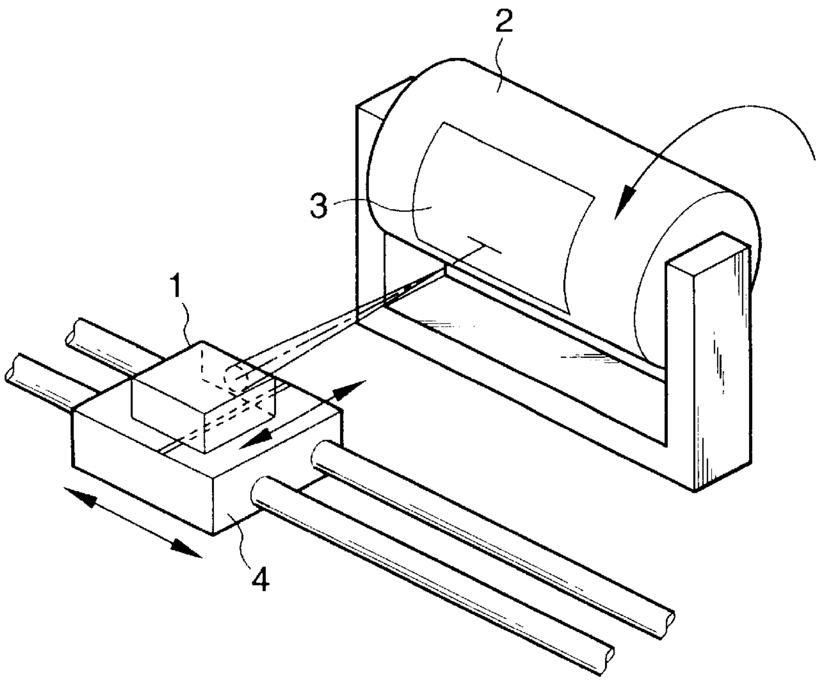
FIG. 9 is a perspective view showing the essential parts of the recording apparatus shown in FIG. 8.
Figure 10:
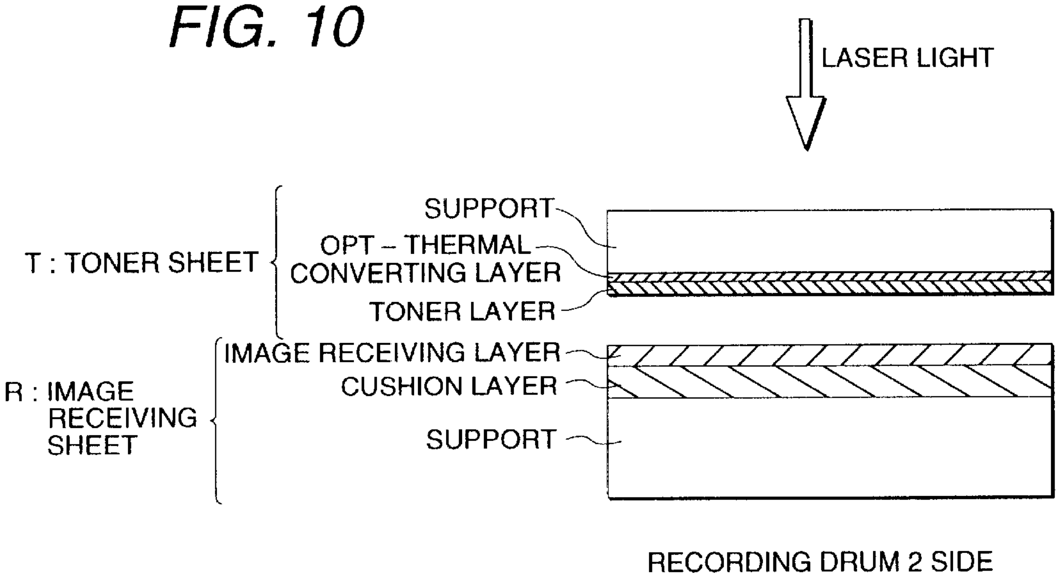
FIG. 10 shows the structures of an receiver film and a transfer film that combine to form the recording medium indicated by 3 in FIG. 9.
Figure 11A:
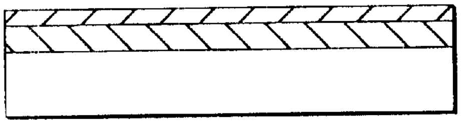
Figure 11B:
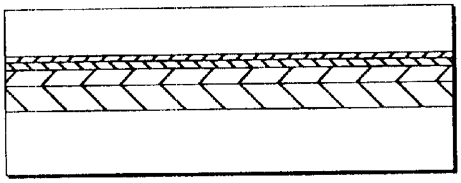
Figure 11C:
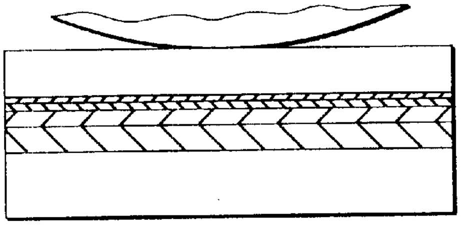
Figure 11D:
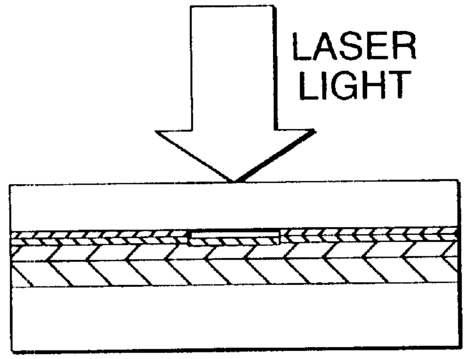
Figure 11E:
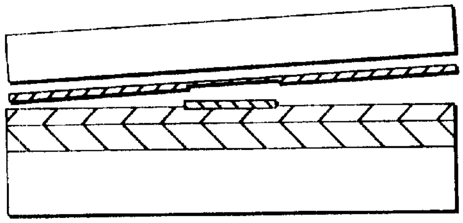
Figure 11E:
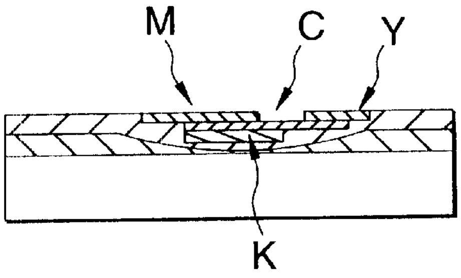

(8) FIG. 7 is a graph showing the temperature change that occurs with time in the central part of a laser beam spot in the sub scanning direction. The horizontal axis of the graph plots time ($\mu$m) from the start of irradiation and the vertical axis plots relative temperature (with room temperature being set to zero). As FIG. 7 shows, a peak temperature is reached in about 3.5 microseconds from the start of irradiation.

Figure 3:
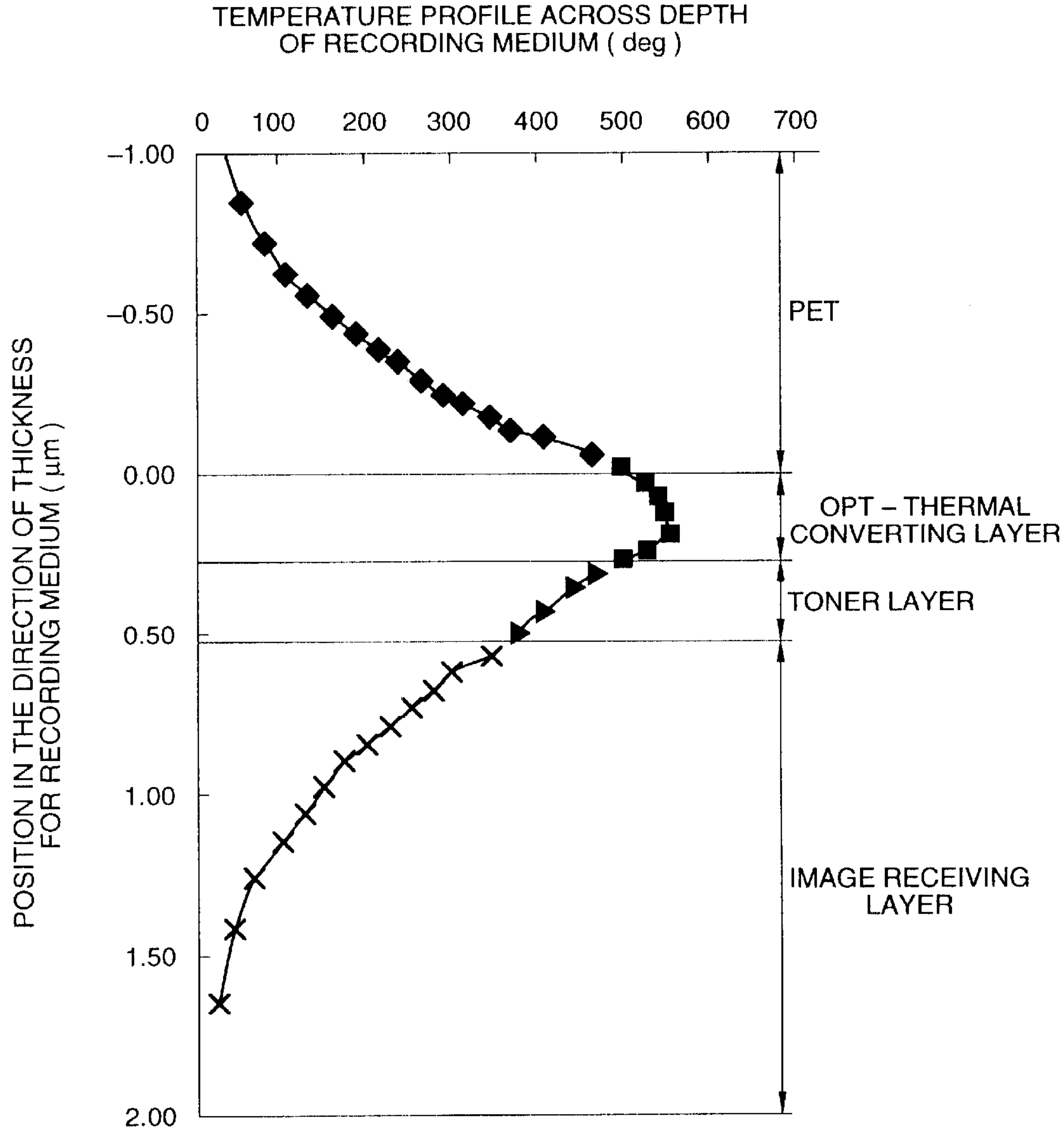
FIG. 3 shows a temperature profile across the depth of a recording medium during recording in the presence of an opto-thermal converting layer having a thickness according to the first embodiment of the invention (ca. 0.3 $\mu$m)
Figure 4:
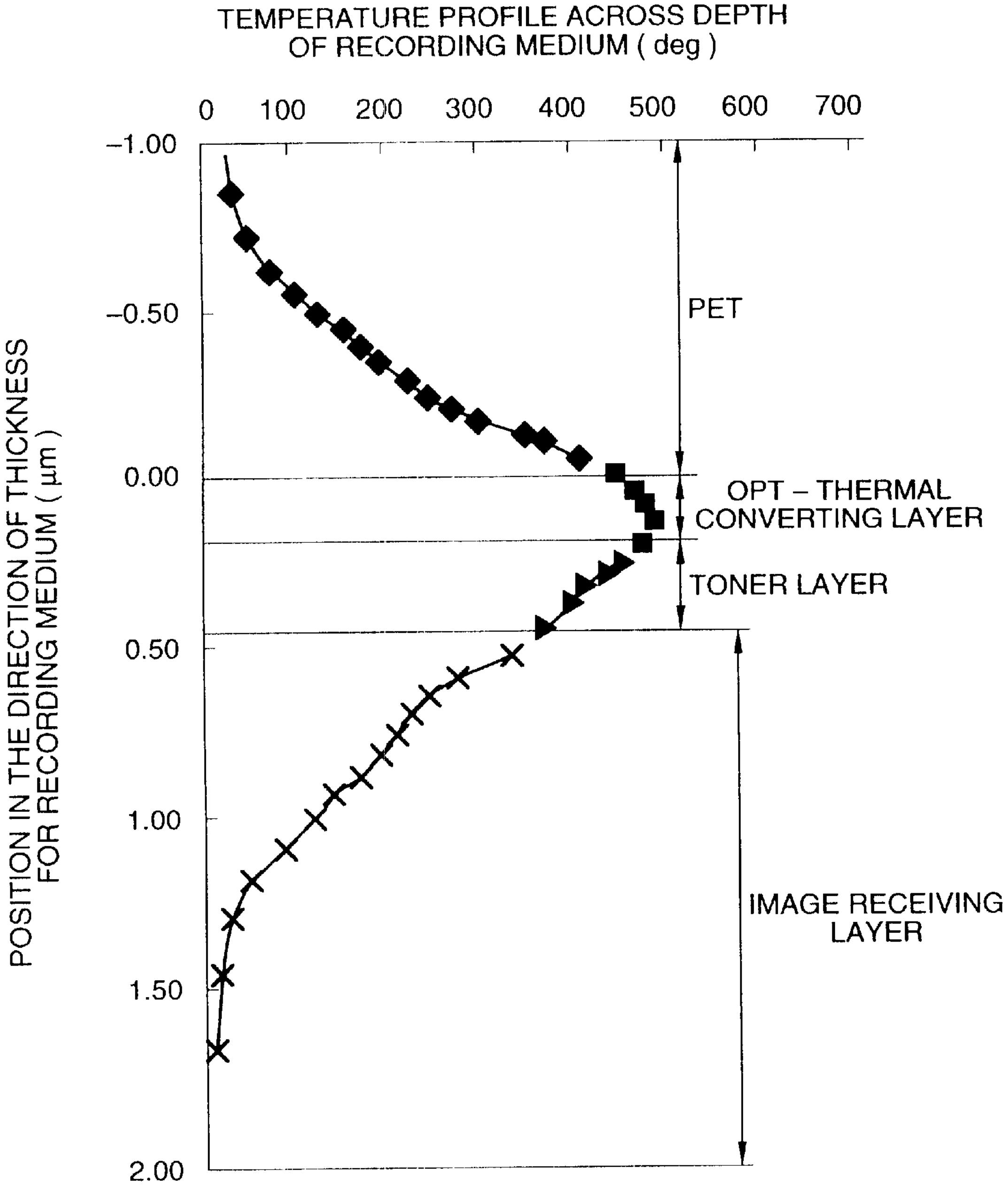
FIG. 4 shows a temperature profile across the depth of a recording medium during recording in the presence of an opto-thermal converting layer having a thickness according to the second embodiment of the invention (ca. 0.2 $\mu$m)

Given these conditions, computer simulation was conducted for the temperature changes that occurred across the thickness of various samples of recording medium. The graphs obtained as computer readouts are shown in FIGS. 2–4.

1) Conventional recording medium (thickness of opto-thermal converting layer=ca. 0.4 $\mu$m)

Figure 2:
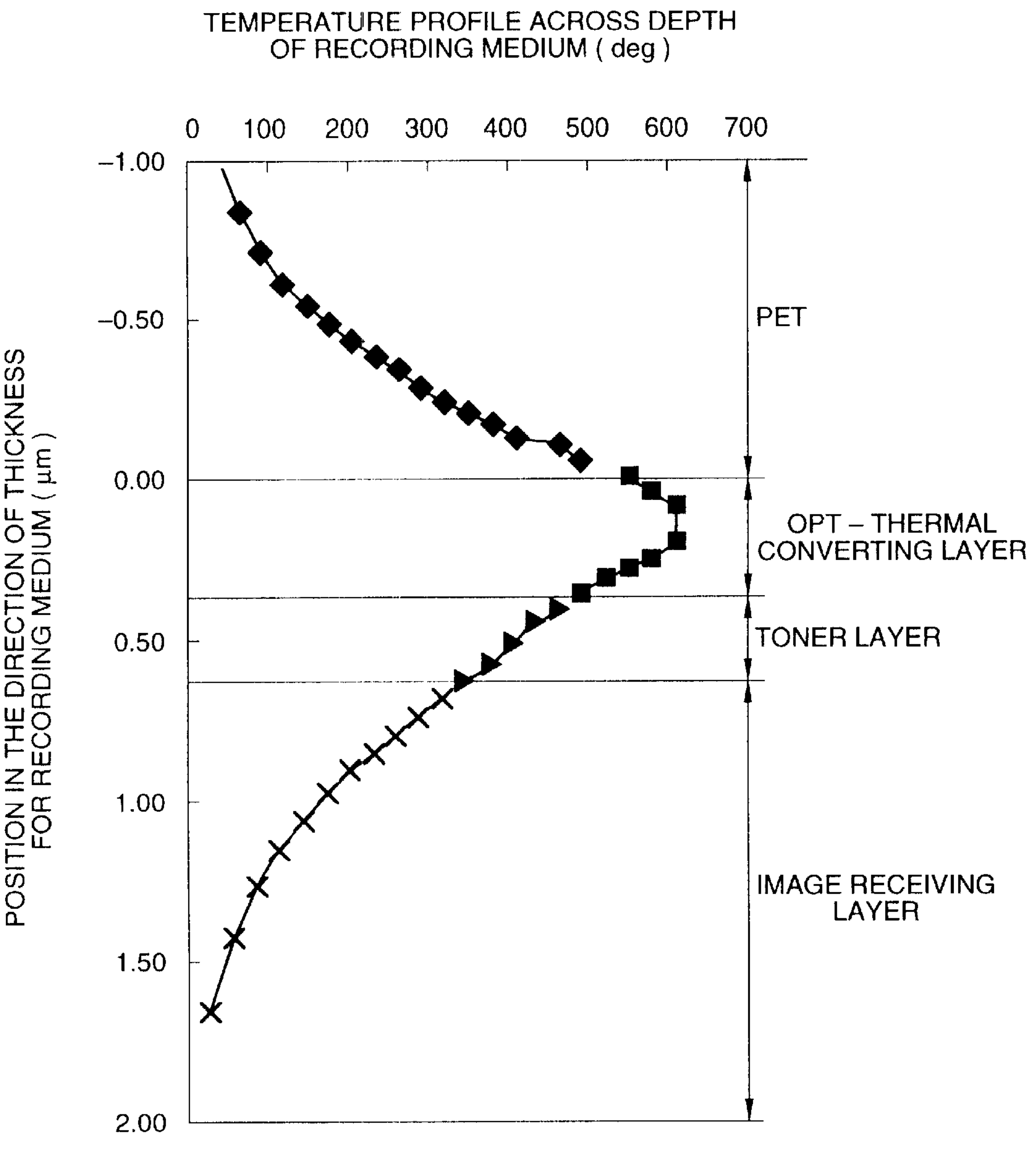
FIG. 2 shows a temperature profile across the depth of a recording medium during recording in the presence of an opto-thermal converting layer having a conventional thickness (ca. 0.4 $\mu$m)

FIG. 2 shows the temperature profile across the depth of a conventional recording medium during recording in the presence of an opto-thermal converting layer about 0.4 $\mu$m thick. The vertical axis of the graph plots the position ($\mu$m) in the direction of the depth of the recording medium; the boundary between the PET support and the opto-thermal converting layer in the transfer film is the reference plane (0 $\mu$m), with positions toward the toner layer being taken as positive ($\mu$m) and positions toward the PET support as negative ($\mu$m). The horizontal axis of the graph plots relative temperature (with room temperature being taken as zero).

According to FIG. 2, when the recording medium having the cross-sectional structure shown in FIG. 5*a* was illuminated with a 250-mW laser beam spot of the rectangular-Gaussian shape, its individual parts (the PET support, opto-thermal converting layer and toner layer in the transfer film, as well as the image receiving layer in the receiver film) experienced the following temperature changes in about 3.5 microseconds from the start of irradiation.

(1) Being transparent, the PET support in the transfer film absorbed little light and the temperature increased with increasing depth (from 0.5 $\mu$m above the opto-thermal converting layer toward the interface between the PET layer and the opto-thermal converting layer).

(2) The temperature peaked at about 600 deg. in the opto-thermal converting layer having a thickness of about 0.4 $\mu$m. The peak temperature occurred in generally the central part of the opto-thermal converting layer.

(3) The temperature at the interface between the opto-thermal converting layer and the toner layer was about 480 deg.

Thus, it became clear that the peak temperature in the direction of thickness of the recording medium was substantially at the center of the opto-thermal converting layer.

Figure 1A:
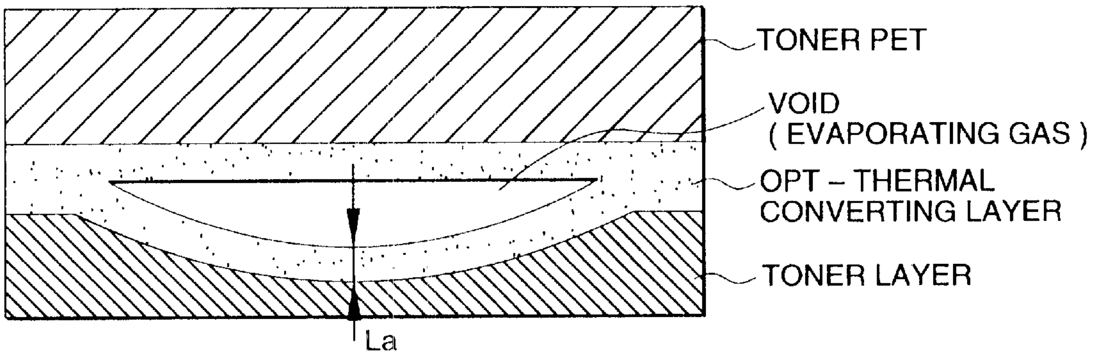
FIG. 1*a* is a schematic cross section of a conventional transfer film after recording as taken in the direction of its thickness.

When the position of the peak temperature was at the center of the opto-thermal converting layer, the toner layer deformed due to the bulging of the opto-thermal converting layer as shown in FIG. 1*a*. This may be explained as follows. First, the solvent used in the step of coating the support with the opto-thermal converting layer could not be entirely removed in the subsequent drying step but partly remained in the dried opto-thermal converting layer. Second, exposure to laser beam produced a hot spot in the central part of the opto-thermal converting layer as shown in FIG. 2. Hence, the residual solvent in that central part evaporated to form a gas. In addition, the thickness of the opto-thermal converting layer above the toner layer was about 0.2 $\mu$m (indicated by La in FIG. 1*a*); what is more, the opto-thermal layer had such a dense structure that the evaporating gas could not easily dissipate to the outside but stayed within to bulge the opto-thermal converting layer, eventually deforming the toner layer to produce a more or less deep concave hollow.

This state is shown in FIG. 1*a;* obviously, the opto-thermal converting layer bulged due to the gas staying within and the toner layer deformed to produce a deep concave hollow. The central part of the bulging opto-thermal converting layer corresponds to the center of the laser beam spot and the peripheral part of the bulge corresponds to the periphery of the beam spot. The width of the bulge was about 5–20 $\mu$m.

Once the toner layer deforms to a curved shape, it remains deformed even after the transfer film has been stripped. As it turned out, a deformation of the toner layer adversely affected the percent transfer even when the amount of the toner layer remained the same and this eventually caused a drop in overall density.

2) Recording medium according to the first embodiment of the invention (thickness of opto-thermal converting layer=¾×conventional thickness, μm).

FIG. 3 shows the temperature profile across the depth of a recording medium during recording in the presence of an opto-thermal converting layer whose thickness was three fourths the value for the conventional case (0.4 μm×¾=0.3 μm). The following are obvious from FIG. 3.

(1) The PET support in the transfer film absorbed little light and the temperature increased with increasing depth (from 0.5 μm above the opto-thermal converting layer toward the interface between the PET layer and the opto-thermal converting layer).

(2) The temperature peaked at about 550 deg. in the opto-thermal converting layer having a thickness of about 0.3 μm. The position of the peak temperature was not in the center of the opto-thermal converting layer but shifted toward the receiver film.

(3) The temperature at the interface between the opto-thermal converting layer and the toner layer was about 450 deg.

Figure 1B:
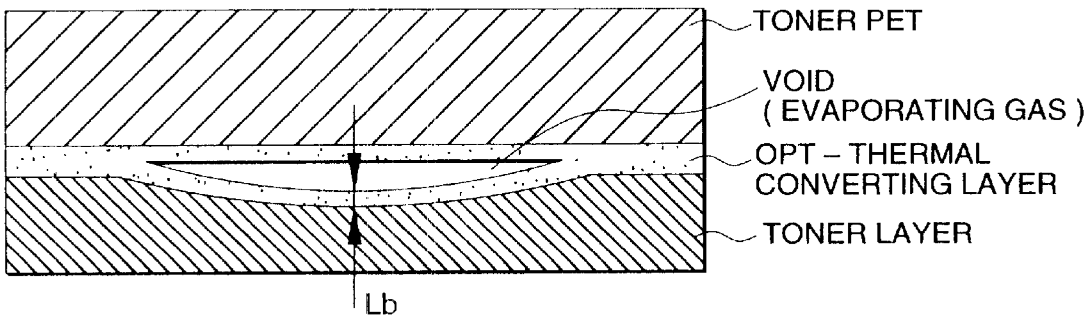
FIG. 1*b* is a schematic cross section of a transfer film according to a first embodiment of the invention.

When the position of the peak temperature in the direction of thickness of the recording medium was not in the center of the opto-thermal converting layer but shifted toward the image receiving layer, the bulging of the opto-thermal converting layer decreased as shown in FIG. 1*b*. This may be explained as follows. First, by reducing the thickness of the opto-thermal converting layer, the amount of the residual solvent in the opto-thermal converting layer was substantially reduced and, hence, the size of the concave hollow shrinked. Second, the reduction in the thickness of the opto-thermal converting layer caused the position of the peak temperature in the thickness direction to become closer to the toner layer as shown in FIG. 3 and the thickness of the opto-thermal converting layer as measured from the position of the peak temperature to the toner surface (indicated by Lc in FIG. 1*c*) became smaller than La. Therefore, even if the residual solvent evaporating in the drying step is in the same amount as in the prior art, the evolved gas finds it easy to pass through the opto-thermal converting layer, eventually causing it to bulge to a smaller extent.

Figure 1C:
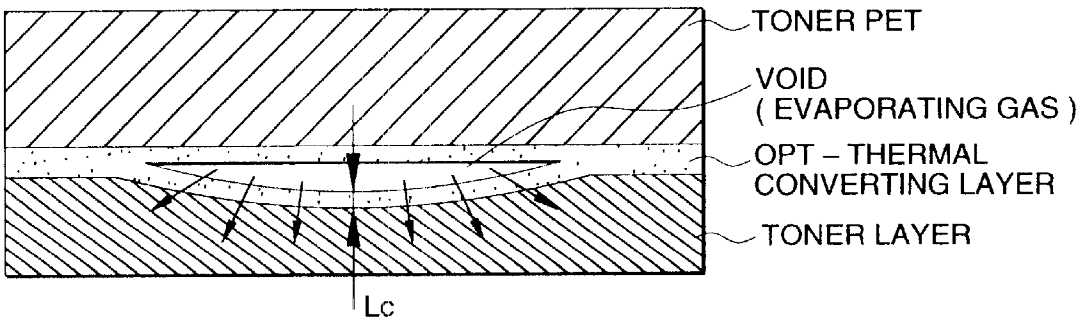
FIG. 1*c* is a schematic cross section of a transfer film according to a second embodiment of the invention.

As is clear from FIGS. 1*b* and 1*c*, the bulging of the opto-thermal converting layer due to the gas staying within caused a more or less shallow concave hollow to form; the percent transfer of the toner layer was not greatly affected by this deformation and the possible density drop could be eventually reduced.

3) Recording medium according to the second embodiment of the invention (thickness of opto-thermal converting layer=½×conventional thickness, μm).

FIG. 4 shows the temperature profile across the depth of a recording medium during recording in the presence of an opto-thermal converting layer whose thickness was one half the value for the conventional case (0.4 μm×½=0.2 μm). The following are obvious from FIG. 4.

(1) The PET support in the transfer film absorbed little light and the temperature increased with increasing depth (from 0.5 μm above the opto-thermal converting layer toward the interface between the PET layer and the opto-thermal converting layer).

(2) The temperature peaked at about 500 deg. in the opto-thermal converting layer having a thickness of about 0.2 μm. The position of the peak temperature was not in the center of the opto-thermal converting layer but made an even greater shift toward the receiver film until it was the closest possible to the toner layer.

(3) The temperature at the interface between the opto-thermal converting layer and the toner layer was about 450 deg.

Thus, the position of the peak temperature in the direction of thickness of the recording medium made an even greater shift toward the image receiving layer than in the case of the opto-thermal converting layer shown in FIG. 3. For the same reasons as set forth in connection with FIG. 3, by reducing the thickness of the opto-thermal converting layer, the amount of the residual solvent in the opto-thermal converting layer was reduced to an even smaller level and, hence, the size of the concave hollow shrinked more. Second, the thickness of the opto-thermal converting layer as measured from the position of the peak temperature to the toner surface became even smaller. Therefore, the evolved gas had greater ease in passing through the opto-thermal converting layer which eventually bulged out to an even smaller extent than shown in FIGS. 1*b* and 1*c*.

As a result, the second embodiment of the invention which used an even thinner opto-thermal converting layer than the first embodiment could achieve a further reduction in density drop.

If the opto-thermal converting layer is made thinner than in the second embodiment, the position of the peak temperature can positively be shifted even closer the toner layer. For instance, when the thickness of the opto-thermal converting layer was 0.1 μm, it experienced little of the deformation shown in FIG. 1*a*.

In summary, the adverse effect of the bulging of the opto-thermal converting layer can be eliminated by ensuring that the distance from the position where a peak temperature occurs in the thickness direction to the toner layer is within the range from zero (as in the second embodiment) to a third (the first embodiment) of the thickness of the opto-thermal converting layer.

It has also been found that even if the thickness of the opto-thermal converting layer is reduced, the sensitivity of the recording medium does not drop markedly and this is probably because the temperature at the interface between the opto-thermal converting layer and the toner layer does not vary much (in the range of ca. 450–480 deg. in the three cases described above).

Factors that determine the position of the peak temperature in the recording medium include the density, percent light absorption, heat conductivity, specific heat and film thickness of each of the constituent layers, the diameter of a recording beam spot, its power, the arrangement, number and wavelengths of recording beam spots, and the recording speed. In the embodiments described above, the thickness of the opto-thermal converting layer has been discussed but this is not the sole case of the invention and as long as the peak temperature occurs near the interface between the opto-thermal converting layer and the toner layer, any other factor, for example, the diameter of a recording laser beam beam may be controlled.

In order to increase the depth at which the peak temperature occurs, "lowering the percent light absorption of the opto-thermal converting layer" is required. A specific way to meet this need by hardware modification is to select a light source emitting in a wavelength range that is absorbed by the opto-thermal converting layer to a small extent that matches the wavelength characteristics of the incorporated infrared absorbing dye. In this case, the problem of prolonged recording time can be dealt with by increasing the power of the light source or producing an increased number of beam spots.

As described on the foregoing pages, the present invention is characterized by adjusting the thickness of the opto-thermal converting layer or some other parameter such that the distance from the position where a peak temperature occurs in the thickness direction to the toner layer is within the range from zero to a third of the thickness of the opto-thermal converting layer. This design reduces the chance of gas evolution within the opto-thermal converting layer during exposure to laser beam and any gas that may be evolved can be easily dissipated to the outside of the recording medium without remaining in the opto-thermal converting layer. Since there is no bulging of the opto-thermal converting layer, satisfactory recording can be done without any undesired density drop.

What is claimed is:

1. A recording method which comprises superposing a transfer film on a receiver film, said transfer film having an opto-thermal converting layer and a toner layer on a support and said receiver film having an image receiving layer on a support, said toner layer being opposed to said image receiving layer, transferring said toner layer onto said image receiving layer by exposure of a laser beam, and stripping said transfer film from said receiver film to form an image, wherein the thickness of said opto-thermal converting layer is adjusted such that the distance from the position where a peak temperature occurs in the direction of thickness of the opto-thermal converting layer to said toner layer is within the range from zero to a third of the thickness of said opto-thermal converting layer.

2. The method of claim 1, wherein said transfer film, the support comprises a rigid material that is in physical contact with the opto-thermal converting layer.

3. The method of claim 2, wherein in said transfer film, the opto-thermal converting layer is in physical contact with the toner layer.

4. The method of claim 1, further wherein said laser beam forms a beam spot on the transfer film such that a cross-sectional shape of an optical intensity distribution which is formed by the beam spot in a scanning direction is controlled to have a rectangular shape and that of in other scanning direction being perpendicular to said scanning direction is controlled to have a Gaussian shape.

* * * * *